(12) United States Patent  
Sumitani et al.

(10) Patent No.: US 8,520,463 B2  
(45) Date of Patent: Aug. 27, 2013

(54) SEMICONDUCTOR INTEGRATED CIRCUIT

(75) Inventors: Norihiko Sumitani, Osaka (JP); Toshio Terano, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/403,014

(22) Filed: Feb. 23, 2012

(65) Prior Publication Data

US 2012/0155211 A1  Jun. 21, 2012

Related U.S. Application Data

(63) Continuation of application No. PCT/JP2010/004259, filed on Jun. 28, 2010.

(30) Foreign Application Priority Data

Sep. 4, 2009  (JP) ................................. 2009-204313

(51) Int. Cl.  
*G11C 5/14*  (2006.01)

(52) U.S. Cl.  
USPC ................................. 365/230.06; 365/230.03

(58) Field of Classification Search  
USPC .......................................... 365/230.03, 230.06  
See application file for complete search history.

(56) References Cited

U.S. PATENT DOCUMENTS

| 6,480,053 | B1 * | 11/2002 | Teramoto ...................... 327/408 |
| 2002/0003244 | A1 | 1/2002 | Tooher et al. |
| 2005/0141289 | A1 * | 6/2005 | Yamaoka et al. ......... 365/189.09 |
| 2006/0092740 | A1 | 5/2006 | Nii |
| 2007/0030741 | A1 * | 2/2007 | Nii et al. ................... 365/189.11 |
| 2008/0037358 | A1 | 2/2008 | Yabuuchi et al. |
| 2008/0253171 | A1 | 10/2008 | Terada et al. |
| 2008/0253172 | A1 | 10/2008 | Yamagami |
| 2009/0003028 | A1 * | 1/2009 | Keshavarzi et al. ............. 365/96 |

FOREIGN PATENT DOCUMENTS

| JP | 11-232878 | 8/1999 |
| JP | 2006-127669 | 5/2006 |
| JP | 2008-004259 | 1/2008 |
| JP | 2008-047180 | 2/2008 |
| JP | 2008-065968 | 3/2008 |
| JP | 2008-262637 | 10/2008 |
| JP | 2008-263067 | 10/2008 |

OTHER PUBLICATIONS

International Search Report of PCT Application No. PCT/JP2010/004259, dated Oct. 12, 2010.

* cited by examiner

*Primary Examiner* — Michael Tran  
(74) *Attorney, Agent, or Firm* — McDermott Will & Emery LLP (57) ABSTRACT

A memory macro includes: a plurality of memory cells arranged in a matrix; a plurality of word lines corresponding to rows of the plurality of memory cells; and a plurality of word line drivers configured to drive the plurality of word lines. The voltage of the word lines in their activated state is set to vary with threshold voltage characteristics of a p-channel transistor and an n-channel transistor.

32 Claims, 10 Drawing Sheets

FIG.6
WRITE LEVEL CONTOUR LINES

SEMICONDUCTOR INTEGRATED CIRCUIT

CROSS-REFERENCE TO RELATED APPLICATIONS

This is a continuation of PCT International Application PCT/JP2010/004259 filed on Jun. 28, 2010, which claims priority to Japanese Patent Application No. 2009-204313 filed on Sep. 4, 2009. The disclosures of these applications including the specifications, the drawings, and the claims are hereby incorporated by reference in their entirety.

BACKGROUND

The present disclosure relates to a semiconductor integrated circuit, and more particularly to a semiconductor integrated circuit having memory macros.

In recent years, with the miniaturization in the semiconductor processes, reduction in the area of semiconductor devices and reduction in power supply voltage are in rapid progress. It is generally known that the threshold voltage Vt of transistors varies with respect to the gate width W and gate length L of the transistors by $1/\sqrt{(L \times W)}$. Therefore, the finer the gate width W and gate length L of the transistors are, the larger the variations of the threshold voltage Vt of the transistors become.

In a semiconductor integrated circuit having flipflop memory cells such as a static random access memory (SRAM), it has become difficult to maintain stable characteristics of the memory cells because of variations in characteristics of transistors constituting the memory cells and reduction in power supply voltage. As a result, the yield of the semiconductor integrated circuit has decreased. In order to fabricate a semiconductor integrated circuit having stable characteristics by miniaturized processes, it is important to prevent or reduce variations in characteristics of components of the semiconductor integrated circuit.

As indicators representing characteristics of the SRAM, a static noise margin (hereinafter abbreviated as SNM) and a write level are used. The SNM represents the retention characteristic of a memory cell exhibited when a bit line pair for the memory cell is activated and the corresponding word line is activated. The larger the SNM value, the better the retention characteristic of the memory cell is. The write level represents the bit line voltage with which information in the memory cell is rewritten once the word line is activated. The larger the write level value, the better the write characteristic is.

The SNM and the write level are in the trade-off relationship. That is, when the SNM is good, write is not easy and thus the write level is low. Conversely, when the write level characteristic is good, write is easy and thus the SNM is small.

Conventionally, pull-down circuits are coupled to the word lines in the SRAM to reduce the activating voltage for the word lines, thereby reducing the conductance of access transistors of memory cells, to improve the SNM (see Japanese Patent Publication No. 2008-262637, for example).

SUMMARY

The SNM and the write level are in the trade-off relationship as described above. If the activating voltage for word lines is reduced excessively, the write level will deteriorate. Therefore, in order to keep both the SNM and the write level satisfactory, the activating voltage for word lines should be set appropriately. However, it has not yet been established concretely on what basis the activating voltage should be determined.

According to an example semiconductor integrated circuit of the present disclosure, the activating voltage for word lines can be set at an appropriate voltage responsive to variations in the fabrication of semiconductor integrated circuits and changes in operating environment.

Specifically, an example semiconductor integrated circuit includes a memory macro including: a plurality of memory cells arranged in a matrix; a plurality of word lines corresponding to rows of the plurality of memory cells; and a plurality of word line drivers configured to drive the plurality of word lines, wherein a voltage of the word lines in their activated state is set to vary with threshold voltage characteristics of a p-channel transistor and an n-channel transistor.

Alternatively, an example semiconductor integrated circuit includes a memory macro including: a plurality of memory cells arranged in a matrix; a plurality of word lines corresponding to rows of the plurality of memory cells; and a plurality of word line drivers configured to drive the plurality of word lines, wherein a voltage of the word lines in their activated state is set to vary with saturation current characteristics of a p-channel transistor and an n-channel transistor.

Alternatively, an example semiconductor integrated circuit includes a memory macro including: a plurality of memory cells arranged in a matrix; a plurality of word lines corresponding to rows of the plurality of memory cells; and a plurality of word line drivers configured to drive the plurality of word lines, wherein a voltage of the word lines in their activated state is set to vary with drain-source leak current characteristics of a p-channel transistor and an n-channel transistor.

Alternatively, an example semiconductor integrated circuit includes a memory macro including: a plurality of memory cells arranged in a matrix; a plurality of word lines corresponding to rows of the plurality of memory cells; and a plurality of word line drivers configured to drive the plurality of word lines, wherein a voltage of the word lines in their activated state is set to change at a given chip temperature.

DETAILED DESCRIPTION

Embodiments of the present disclosure will be described hereinafter with reference to the accompanying drawings.

First Embodiment

Figure 1:
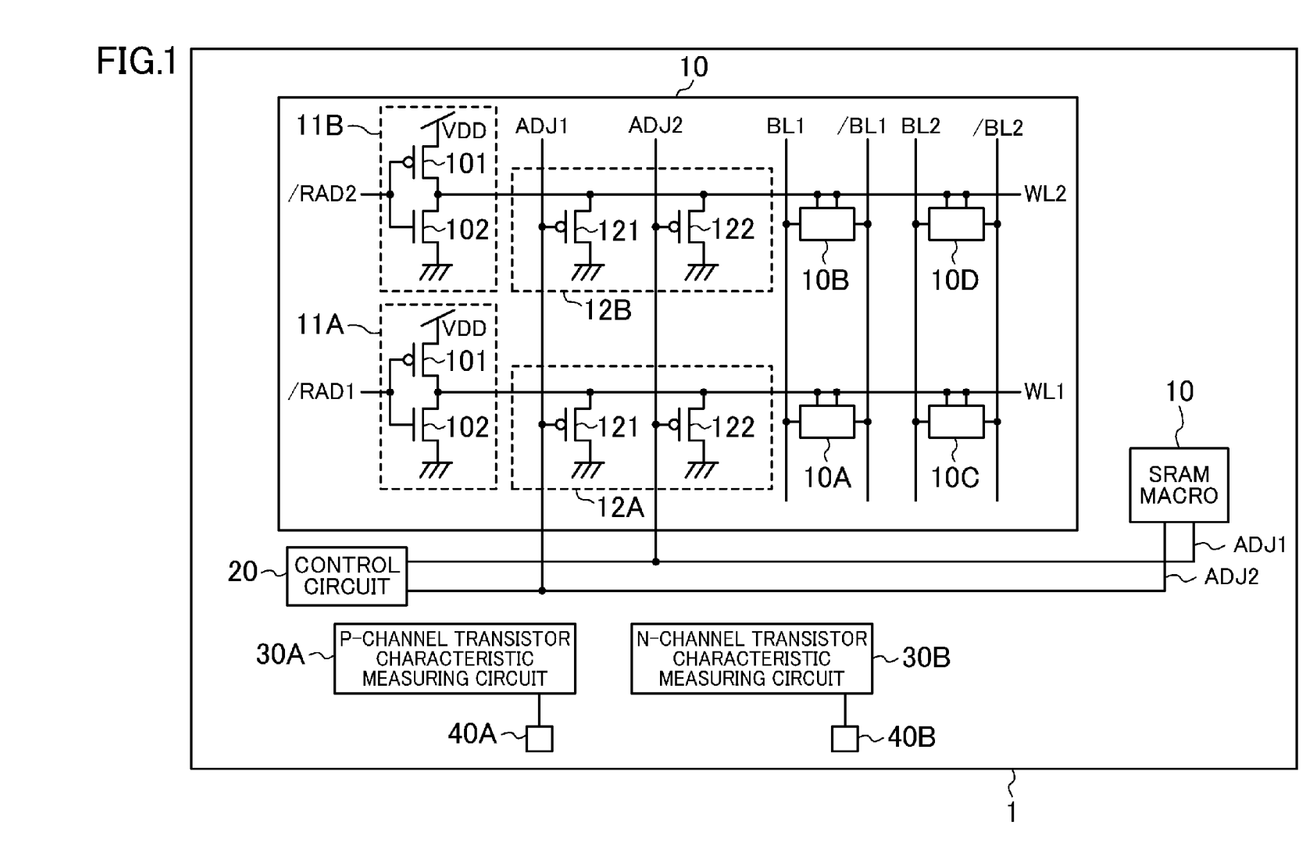
FIG. 1 is a block diagram of a semiconductor integrated circuit of a first embodiment.

FIG. 1 is a block diagram of a semiconductor integrated circuit 1 of the first embodiment. An SRAM macro 10 includes memory cells 10A-10D, word line drivers 11A and 11B, and pull-down circuits 12A and 12B. A bit line pair BL1, /BL1 is coupled to the memory cells 10A and 10B, and a bit line pair BL2, /BL2 is coupled to the memory cells 10C and 10D. A word line WL1 is coupled to the memory cells 10A and 10C, and a word line WL2 is coupled to the memory cells 10B and 10D. Note that, although not shown, there are more memory cells like the memory cells 10A-10D arranged in a matrix, and bit line pairs and word lines coupled to such memory cells. These memory cells store data, constituting a memory array.

The word line drivers 11A and 11B each have an inverter structure including a p-channel transistor 101 and an n-channel transistor 102. The word line drivers 11A and 11B respectively invert row address signals /RAD1 and /RAD2 and output the inverted signals to the word lines WL1 and WL2.

The pull-down circuits 12A and 12B each receive control signals ADJ1 and ADJ2 at p-channel transistors 121 and 122, respectively, to pull down the output voltages of their corresponding word line drivers 11A and 11B. Note that it is preferable to set the gate widths of the p-channel transistors 121 and 122 to be different between the pull-down circuits 12A and 12B, so that the voltages pulled down by the pull-down circuits 12A and 12B are different from each other.

A control circuit 20 outputs the two-bit control signals ADJ1 and ADJ2 for controlling the word line activating voltage. The control circuit 20 can be made of electrically programmable fuses (eFUSEs) that output the control signals ADJ1 and ADJ2 as fixed signals. Alternatively, the control circuit 20 may read control values stored in a flash memory, etc. and output control signals having the control values.

Figure 2:
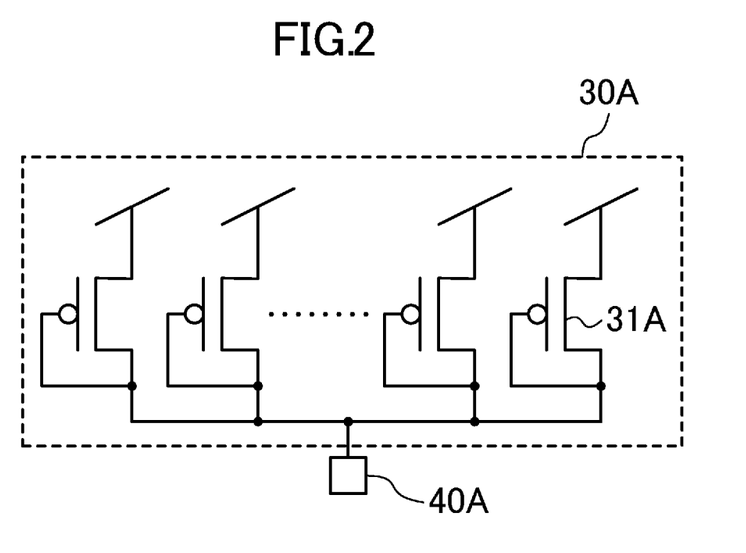
FIG. 2 is a circuit diagram of a p-channel transistor characteristic measuring circuit.

FIG. 2 is a circuit diagram of a p-channel transistor characteristic measuring circuit 30A. It is desirable that p-channel transistors 31A are the same in shape as load transistors 111 and 112 of the memory cells 10A-10D in FIG. 1, which will be described later.

Figure 3:
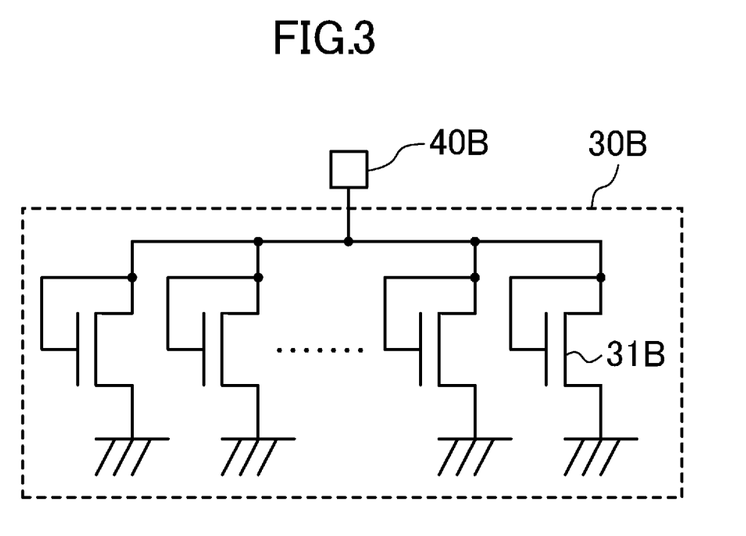
FIG. 3 is a circuit diagram of an n-channel transistor characteristic measuring circuit.

FIG. 3 is a circuit diagram of an n-channel transistor characteristic measuring circuit 30B. It is desirable that n-channel transistors 31B are the same in shape as drive transistors 113 and 114 and access transistors 115 and 116 of the memory cells 10A-10D in FIG. 1, which will be described later.

In the transistor characteristic measuring circuits 30A and 30B, voltages are applied to input terminals 40A and 40B, and the current values flowing through the input terminals 40A and 40B are measured, whereby average characteristics of the transistors 31A and 31B can be obtained. Alternatively, currents may be supplied to flow through the input terminals 40A and 40B, to measure the voltages at the input terminals 40A and 40B. Such measurement can be performed easily by using a test apparatus for measuring the semiconductor integrated circuit 1, etc. Note that the sources, drains, and gates of the transistors may be used as independent input terminals for the transistor characteristic measuring circuits 30A and 30B.

Figure 4:
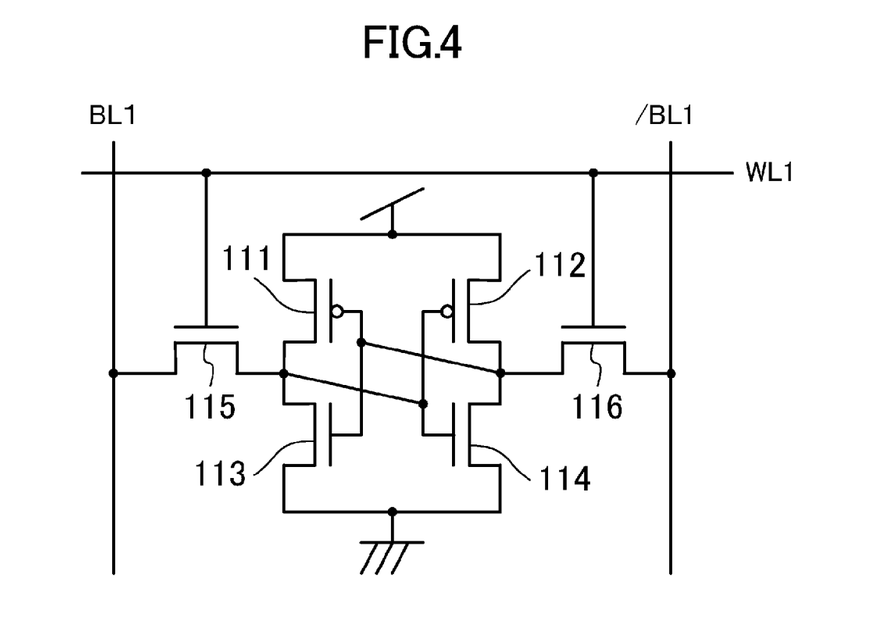
FIG. 4 is a circuit diagram showing a configuration of a memory cell.

FIG. 4 is a circuit diagram of the memory cell 10A, which includes the load transistors 111 and 112, the drive transistors 113 and 114, and the access transistors 115 and 116.

The load transistor 111 and the drive transistor 113 constitute an inverter, and the load transistor 112 and the drive transistor 114 constitute an inverter. These inverters constitute a flipflop to store data. Note that the memory cells 10B-10D also have similar configurations.

Data is written into the memory cell 10A by activating the word line WL1 while allowing the potential of one of BL1 and /BL1 to be high (H) while the potential of the other to be low (L). Data is read from the memory cell 10A by precharging the bit lines BL1 and /BL1 to high in advance and, while activating the word line WL1, allowing the potential of one of BL1 and /BL1 to go low from high based on the stored state of the flipflop of the memory cell 10A.

Figure 5:
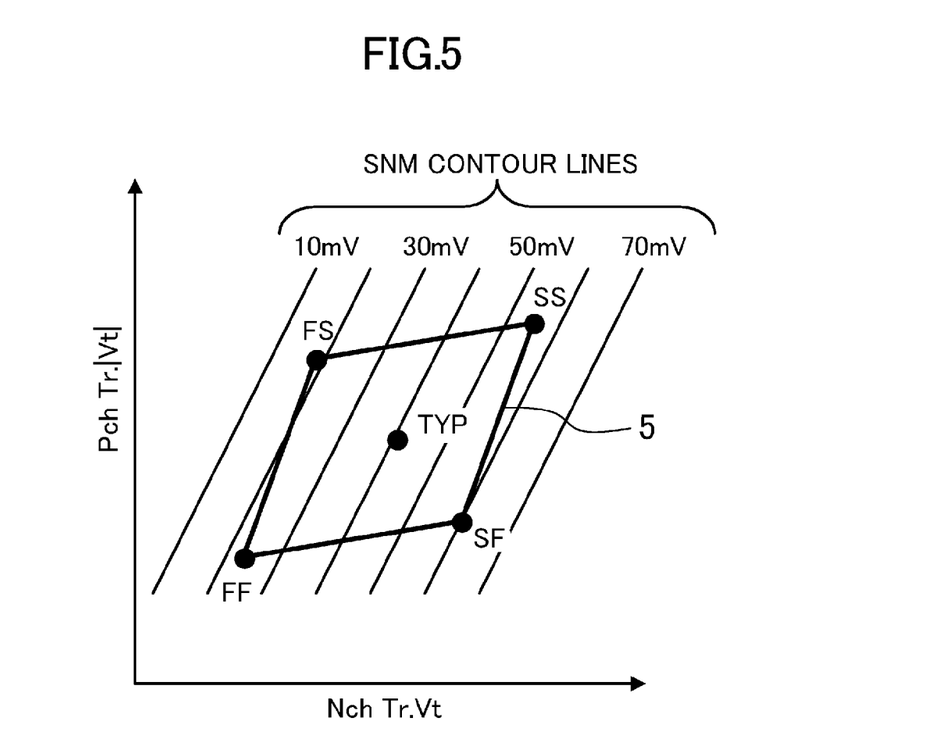
FIG. 5 is a graph showing the relationship between the threshold voltages of p-channel and n-channel transistors and contour lines of the SNM.

FIG. 5 is a graph showing the relationship between the threshold voltages of p-channel and n-channel transistors and SNM contour lines. Note that the values of the SNM contour lines vary with the process conditions, the transistor sizes, etc. The x-axis of the graph represents the threshold voltage of n-channel transistors, and the y-axis represents the absolute value of the threshold voltage of p-channel transistors, which also apply in FIG. 6 to follow. The reference character 5 denotes the range of threshold voltages generally allowable as a characteristic of transistors. The range 5 is called a global window, which shows global variations of threshold voltages. The global variations of threshold voltages refer to average values of threshold voltages of transistors placed on a chip.

As shown in FIG. 5, a portion close to point FF is a region where the threshold voltage of the n-channel transistor is lower than its typical value (hereinafter referred to as TYP) and the absolute value of the threshold voltage of the p-channel transistor is lower than TYP. A portion close to point FS is a region where the threshold voltage of the n-channel transistor is lower than TYP and the absolute value of the threshold voltage of the p-channel transistor is higher than TYP. A portion close to point SS is a region where the threshold voltage of the n-channel transistor is higher than TYP and the absolute value of the threshold voltage of the p-channel transistor is higher than TYP. A portion close to point SF is a region where the threshold voltage of the n-channel transistor is higher than TYP and the absolute value of the threshold voltage of the p-channel transistor is lower than TYP.

In the FS portion, since the conductance of the access transistors is high, H data flows from a bit line, causing failure in retaining L-side data. Since it is no more possible to retain H data that is held in a p-channel transistor of the memory cell, the SNM deteriorates. To improve the SNM, the word line activating voltage may be reduced to reduce the conductance of the access transistors. Contrarily, in the SF portion, since the conductance of the access transistors is low, H data does not easily flow from a bit line, resulting in good data retention characteristic on the L-side. Since the retention characteristic of H data held in a p-channel transistor of the memory cell is good, the SNM improves.

Figure 6:
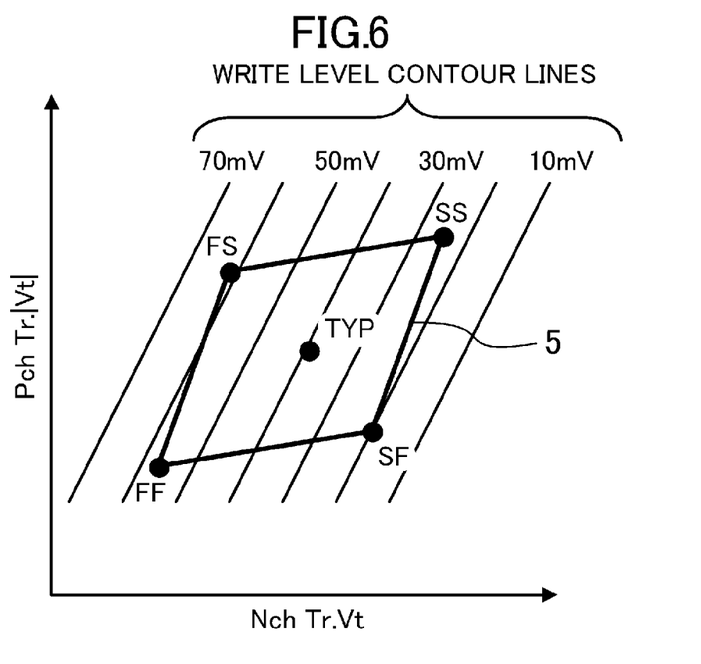
FIG. 6 is a graph showing the relationship between the threshold voltages of p-channel and n-channel transistors and contour lines of the write level.

FIG. 6 is a graph showing the relationship between the threshold voltages of p-channel and n-channel transistors and write level contour lines. Note that the values of the write level contour lines vary with the process conditions, the transistor sizes, etc. In the FS portion, since the conductance of the access transistors is high, L data easily flows from a bit line. Since the absolute value of the threshold voltage of the p-channel transistors of the memory cell is high, H data held can be easily rewritten. Thus, the write level improves. Contrarily, in the SF portion, since the conductance of the access transistors is low, L data does not easily flow from a bit line. Since the absolute value of the threshold voltage of the p-channel transistors of the memory cell is low, H data held cannot be easily rewritten. Thus, the write level deteriorates. To improve the write level, the word line activating voltage must be increased.

Because the SNM and the write level are in the trade-off relationship in characteristics of the memory cells, a low word line activating voltage may be set in the FS portion and a high word line activating voltage in the SF portion. With this setting, the SNM value and the write level value in the FS portion can be made close to those in the SF portion. In other words, the SNM and the write level can be improved. Some of methods of determining the word line activating voltage will be described hereinafter.

Word Line Activating Voltage Determination Method 1

Figure 7:
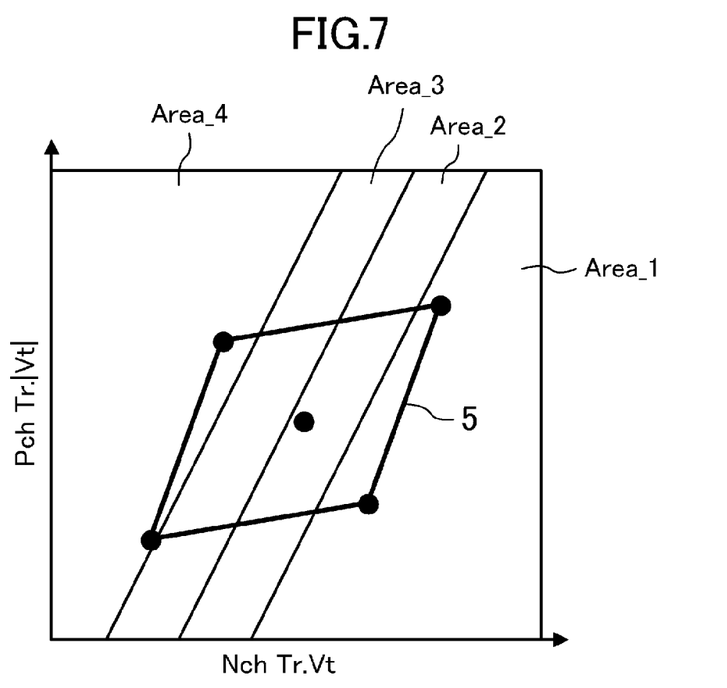
FIG. 7 is a graph showing the relationship between a global window and the range of a preferable word line activating voltage.

FIG. 7 is a graph showing the relationship between a global window 5 and the range of a preferable word line activating voltage. The word line activating voltage that makes both the SNM and the write level satisfactory varies with the threshold voltages of p-channel and n-channel transistors, which can be obtained by a simulation program with integrated circuit emphasis (SPICE), etc. In consideration of this, the graph of FIG. 7 is divided into four areas Area_1 to Area_4, for example, and the word line activating voltage is determined depending on to which one of the four areas the threshold voltages of the p-channel and n-channel transistors belong. The word line activating voltages corresponding to the areas Area_1 to Area_4 are V1 to V4, respectively, where the voltage decreases in order of V1 to V4. V1 is the power supply voltage VDD applied to the word line drivers 11A and 11B. The areas Area_1 to Area_4 may be delimited from each other with straight lines or curved lines.

Specifically, the word line activating voltage is determined in the following manner. First, the threshold voltage of the p-channel transistors 31A is measured in the p-channel transistor characteristic measuring circuit 30A in FIG. 1, and the threshold voltage of the n-channel transistors 31B is measured in the n-channel transistor characteristic measuring circuit 30B in FIG. 1. By the determination of the threshold voltage of the p-channel transistors 31A, a plurality of threshold voltage ranges related to n-channel transistors are determined uniquely. Then, the word line activating voltage is determined depending on to which one of the threshold voltage ranges the threshold voltage of the n-channel transistors 31B belongs.

Word Line Activating Voltage Determination Method 2

Figure 8:
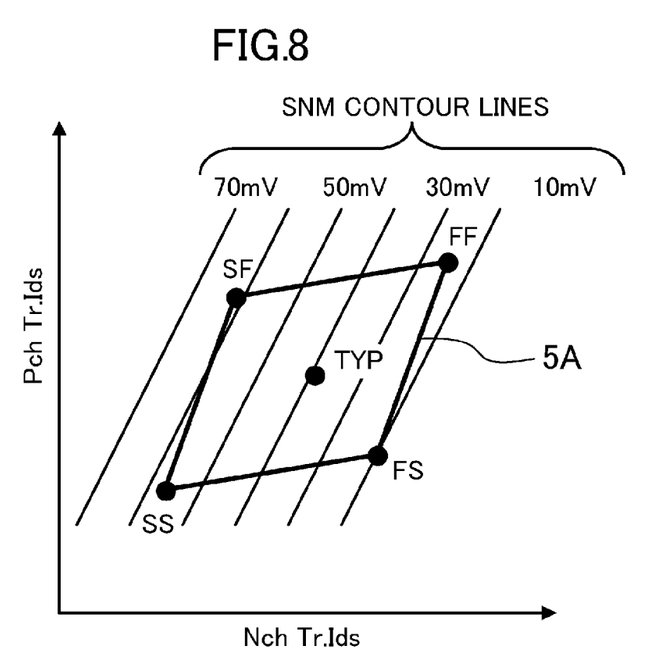
FIG. 8 is a graph showing the relationship between the drain-source saturation currents of p-channel and n-channel transistors and contour lines of the SNM.
Figure 9:
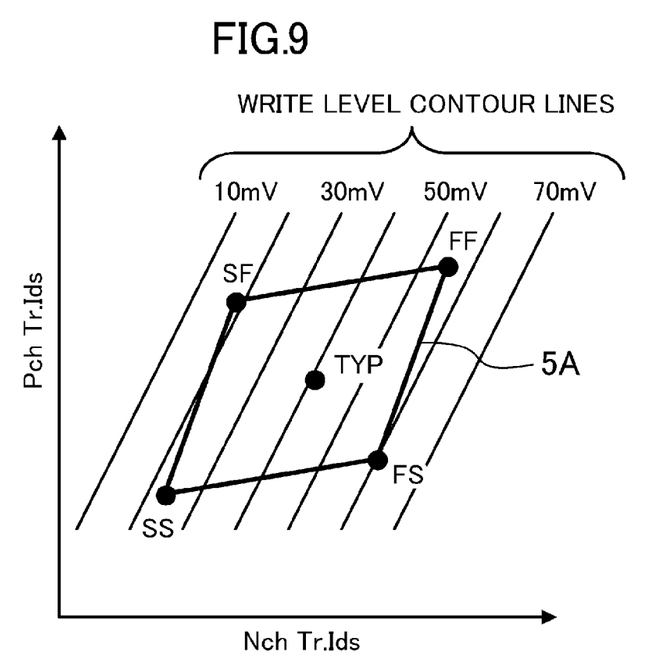
FIG. 9 is a graph showing the relationship between the drain-source saturation currents of p-channel and n-channel transistors and contour lines of the write level.

The x-axis of the graphs of FIGS. 8 and 9 represents the drain-source saturation current of n-channel transistors, and the y-axis represents the drain-source saturation current of p-channel transistors. As shown in FIG. 8, the SNM deteriorates in the FS portion. To improve the SNM in the FS portion, the word line activating voltage may be set at a low value. As shown in FIG. 9, the write level deteriorates in the SF portion. To improve the write level in the SF portion, the word line activating voltage may be set at a high value.

Figure 10:
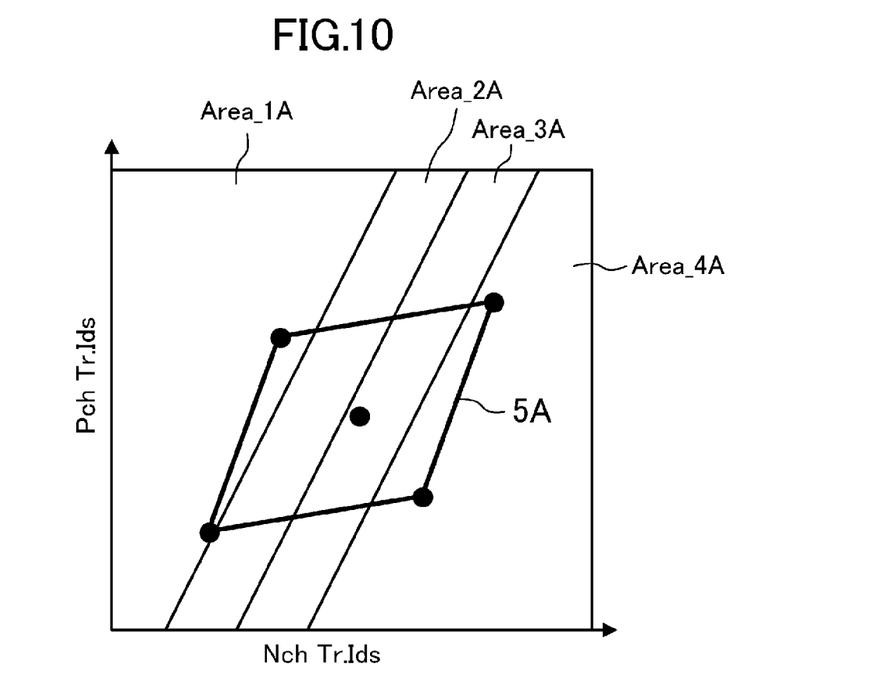
FIG. 10 is another graph showing the relationship between a global window and the range of a preferable word line activating voltage.

FIG. 10 is a graph showing the relationship between a global window 5A and the range of a preferable word line activating voltage. The word line activating voltage that makes both the SNM and the write level satisfactory varies with the drain-source saturation currents of the p-channel and n-channel transistors, which can be obtained by SPICE simulation, etc., for example. In consideration of this, the graph of FIG. 10 is divided into four areas Area_1A to Area_4A, for example, and the word line activating voltage is determined depending on to which one of the four areas the drain-source saturation currents of the p-channel and n-channel transistors belong. The word line activating voltages corresponding to the areas Area_1A to Area_4A are V1 to V4, respectively, where the voltage decreases in order of V1 to V4. The areas Area_1A to Area_4A may be delimited from each other with straight lines or curved lines.

The word line activating voltage determination method will be described in a specific manner. First, the drain-source saturation current of the p-channel transistors 31A is measured in the p-channel transistor characteristic measuring circuit 30A in FIG. 1, and the drain-source saturation current of the n-channel transistors 31B is measured in the n-channel transistor characteristic measuring circuit 30B in FIG. 1. By the determination of the drain-source saturation current of the p-channel transistors 31A, a plurality of saturation current ranges related to n-channel transistors are determined uniquely. Then, the word line activating voltage is determined depending on to which one of the saturation current ranges the drain-source saturation current of the n-channel transistors 31B belongs.

Word Line Activating Voltage Determination Method 3

Figure 11:
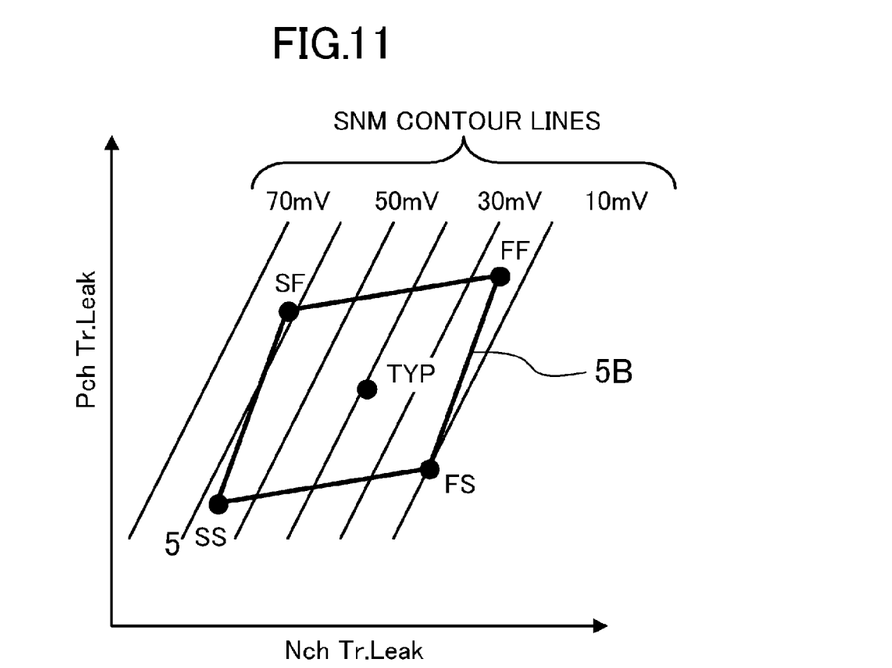
FIG. 11 is a graph showing the relationship between the drain-source off-leak currents of p-channel and n-channel transistors and contour lines of the SNM.
Figure 12:
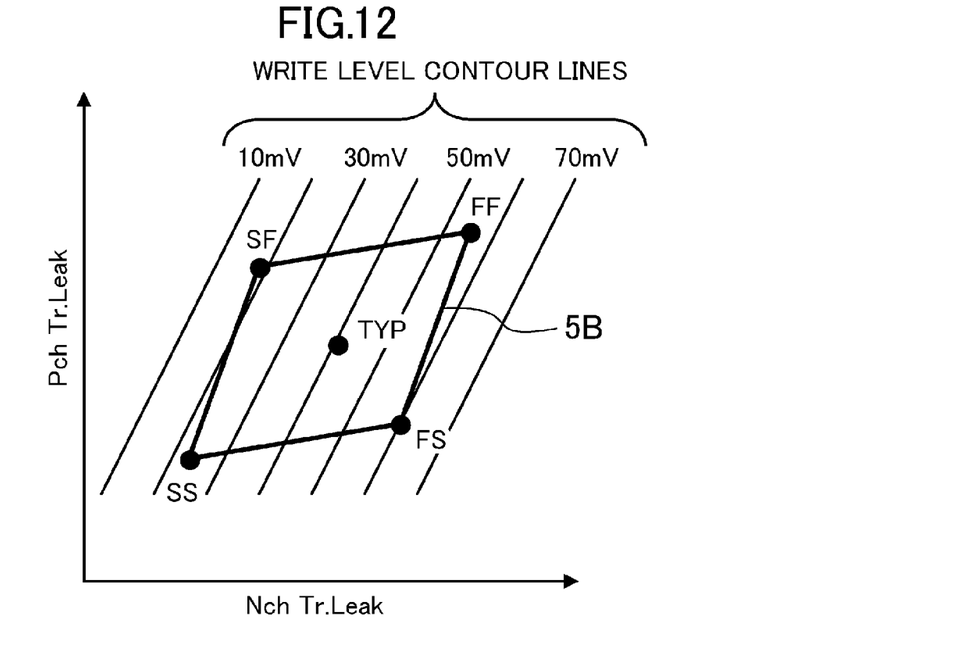
FIG. 12 is a graph showing the relationship between the drain-source off-leak currents of p-channel and n-channel transistors and contour lines of the write level.

The x-axis of the graphs of FIGS. 11 and 12 represents the drain-source off-leak current of n-channel transistors, and the y-axis represents the drain-source off-leak current of p-channel transistors. As shown in FIG. 11, the SNM deteriorates in the FS portion. To improve the SNM in the FS portion, the word line activating voltage may be set at a low value. As shown in FIG. 12, the write level deteriorates in the SF portion. To improve the write level in the SF portion, the word line activating voltage may be set at a high value.

Figure 13:
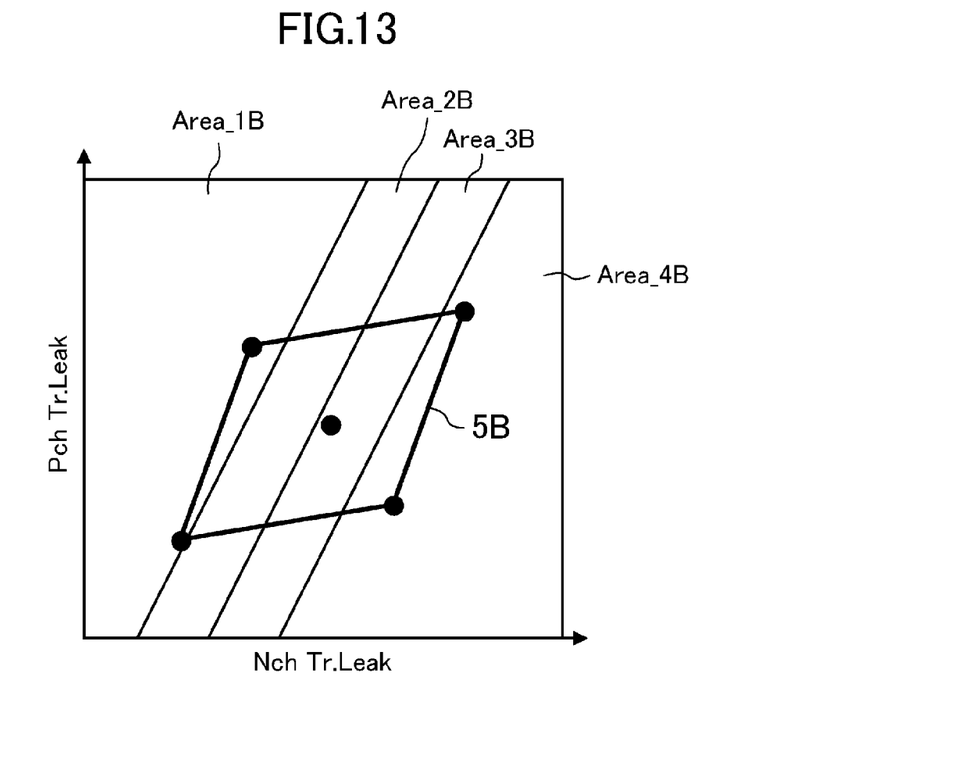
FIG. 13 is yet another graph showing the relationship between a global window and the range of a preferable word line activating voltage.

FIG. 13 is a graph showing the relationship between a global window 5B and the range of a preferable word line activating voltage. The word line activating voltage that makes both the SNM and the write level satisfactory varies with the drain-source off-leak currents of the p-channel and n-channel transistors, which can be obtained by SPICE simulation, etc., for example. In consideration of this, the graph of FIG. 13 may be divided into four areas Area_1B to Area_4B, and the word line activating voltage is determined depending on to which one of the four areas the drain-source off-leak currents of the p-channel and n-channel transistors belong. The word line activating voltages corresponding to the areas Area_1B to Area_4B are V1 to V4, respectively, where the voltage decreases in order of V1 to V4. The areas Area_1B to Area_4B may be delimited from each other with straight lines or curved lines.

The word line activating voltage determination method will be described in a specific manner. First, the drain-source off-leak current of the p-channel transistors 31A is measured in the p-channel transistor characteristic measuring circuit 30A in FIG. 1, and the drain-source off-leak current of the n-channel transistors 31B is measured in the n-channel transistor characteristic measuring circuit 30B in FIG. 1. By the determination of the drain-source off-leak current of the p-channel transistors 31A, a plurality of off-leak current ranges related to n-channel transistors are determined uniquely. Then, the word line activating voltage is determined depending on to which one of the off-leak current ranges the drain-source off-leak current of the n-channel transistors 31B belongs.

Figure 14:
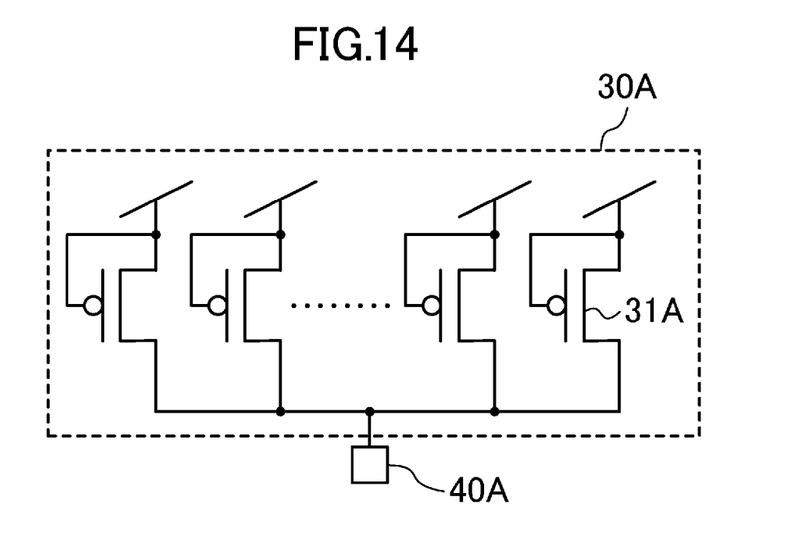
FIG. 14 is another circuit diagram of the p-channel transistor characteristic measuring circuit.
Figure 15:
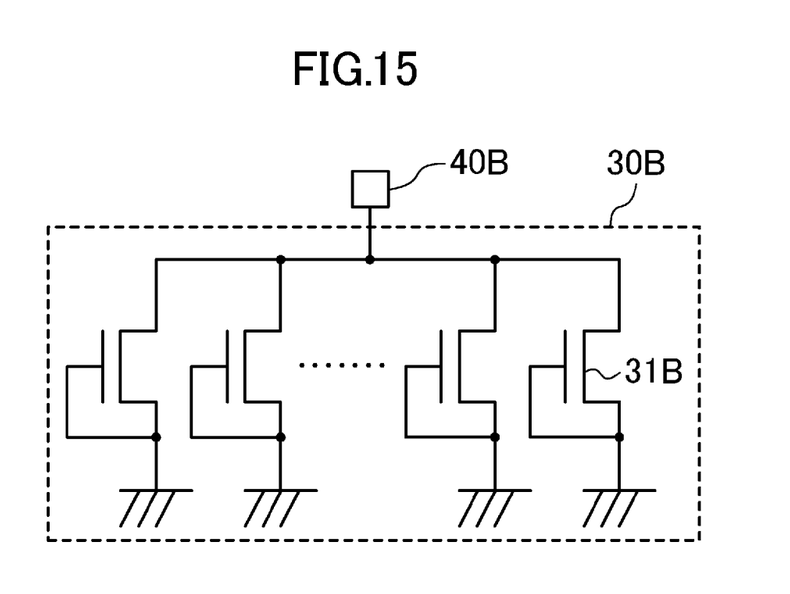
FIG. 15 is another circuit diagram of the n-channel transistor characteristic measuring circuit.

For measurement of the off-leak currents, the transistor characteristic measuring circuits 30A and 30B may be configured as shown in FIGS. 14 and 15, respectively. In this case, voltages are applied to the input terminals 40A and 40B, to measure the currents flowing through the input terminals 40A and 40B. Alternatively, currents may be supplied to flow through the input terminals 40A and 40B, to measure the voltages at the input terminals 40A and 40B.

With the determination of the word line activating voltage by any of the above methods, the control values of the control signals ADJ1 and ADJ2 are determined uniquely (see Table 1 below). Therefore, eFUSEs, etc. are blown appropriately to allow the control values of the control signals ADJ1 and ADJ2 to take predetermined values. Note that the measurement by the transistor characteristic measuring circuits 30A and 30B and the setting of the control values of the control signals ADJ1 and ADJ2 can be performed easily by a test apparatus for measuring the semiconductor integrated circuit 1, etc. in a series of its measurement.

TABLE 1

| ADJ2 | ADJ1 | WORD LINE ACTIVATING VOLTAGE |
|---|---|---|
| H | H | V1 |
| H | L | V2 |
| L | H | V3 |
| L | L | V4 |

As described above, by determining the word line activating voltage in accordance with characteristics of the p-channel and n-channel transistors, it is possible to prevent or reduce deterioration in the characteristic of either the SNM or the write level, thereby improving both the SNM and the write level characteristics. Moreover, for a memory cell having the characteristics of point SS, the speed at which the access transistors turn on/off increases by setting the word line activating voltage at VDD. Thus, the read level can be improved.

The transistor characteristic measuring circuits 30A and 30B may be placed on a scribe lane of the wafer, for example. Also, in the case of placing a plurality of memory macros different in transistor shape, injection amount, etc., a plurality of transistor characteristic measuring circuits corresponding to the different memory macros may be provided.

When the transistors 111-116 and other p-channel and n-channel transistors used in logic sections are the same or approximately the same in injection amount, these transistors are correlated with each other in global threshold voltages. Therefore, it is unnecessary to measure characteristics of the transistors 111-116 by the transistor characteristic measuring circuits 30A and 30B: i.e., measurement of characteristics of the transistors in the logic sections will equate to measurement of the characteristics of the transistors 111-116.

The word line activating voltage may vary among semiconductor integrated circuits, or vary among memory macros placed in a semiconductor integrated circuit.

The pull-down circuits 12A and 12B in FIG. 1 each include two p-channel transistors 121 and 122 to allow four-stage setting of the word line activating voltage. Alternatively, the number of p-channel transistors may be increased to allow setting of the word line activating voltage in a larger number of stages. Also, a similar effect can be obtained by using n-channel transistors to constitute the pull-down transistors.

Second Embodiment

Figure 16:
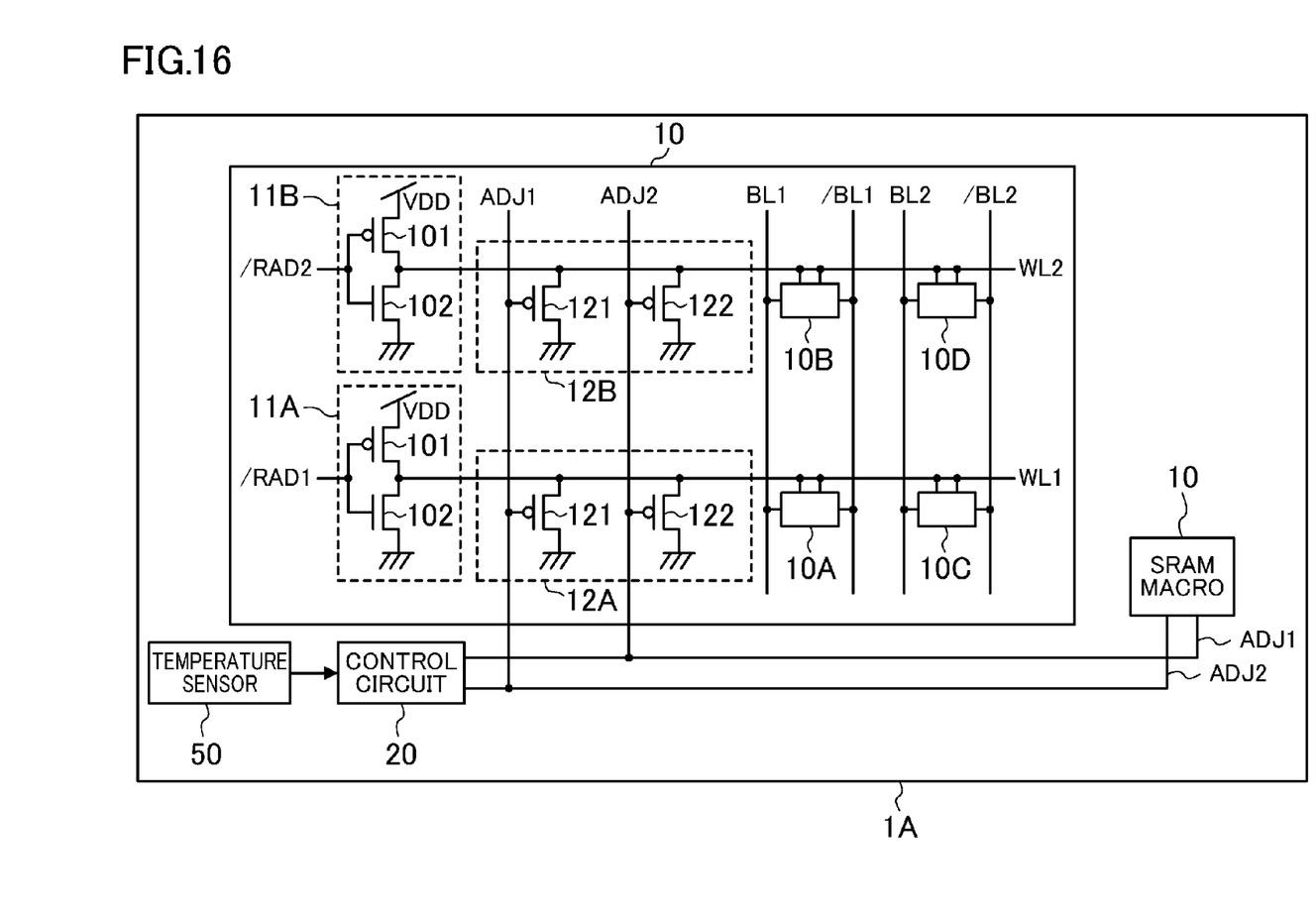
FIG. 16 is a block diagram of a semiconductor integrated circuit of a second embodiment.

FIG. 16 is a block diagram of a semiconductor integrated circuit 1A of the second embodiment. Only a difference from the first embodiment will be described hereinafter.

Figure 17:
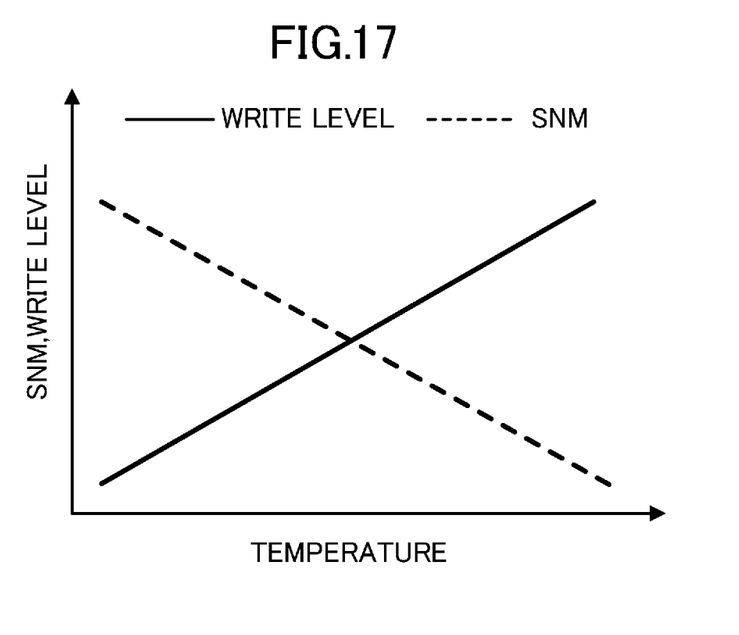
FIG. 17 is a graph showing the relationship between the temperature and the SNM/write level of a general semiconductor integrated circuit.

FIG. 17 is a graph showing the relationship between the temperature and the SNM/write level. As the temperature rises, the conductance of the access transistors constituting each memory cell increases. Therefore, with rise in temperature, the SNM deteriorates while the write level enhances. To improve the SNM when the temperature is high, the word line activating voltage may be set at a low value. Contrarily, to improve the write level when the temperature is low, the word line activating voltage may be set at a high value.

In consideration of the above, the word line activating voltage is changed with the temperature. Specifically, a temperature sensor 50 detects the temperature of the semiconductor integrated circuit 1A, and the control circuit 20 changes the control signals ADJ1 and ADJ2 in accordance with the detected temperature. Table 2 below shows the relationship between the word line activating voltage and the control signals ADJ1 and ADJ2 with respect to the temperature of the semiconductor integrated circuit 1A. The control circuit 20 changes the control values of the control signals ADJ1 and ADJ2 in accordance with the temperature detected by the temperature sensor 50.

TABLE 2

| ADJ2 | ADJ1 | TEMPERATURE | WORD LINE ACTIVATING VOLTAGE |
|---|---|---|---|
| H | H | UP TO T1 | V1 |
| H | L | T1-T2 | V2 |
| L | H | T2-T3 | V3 |
| L | L | HIGHER THAN T3 | V4 |

Figure 18:
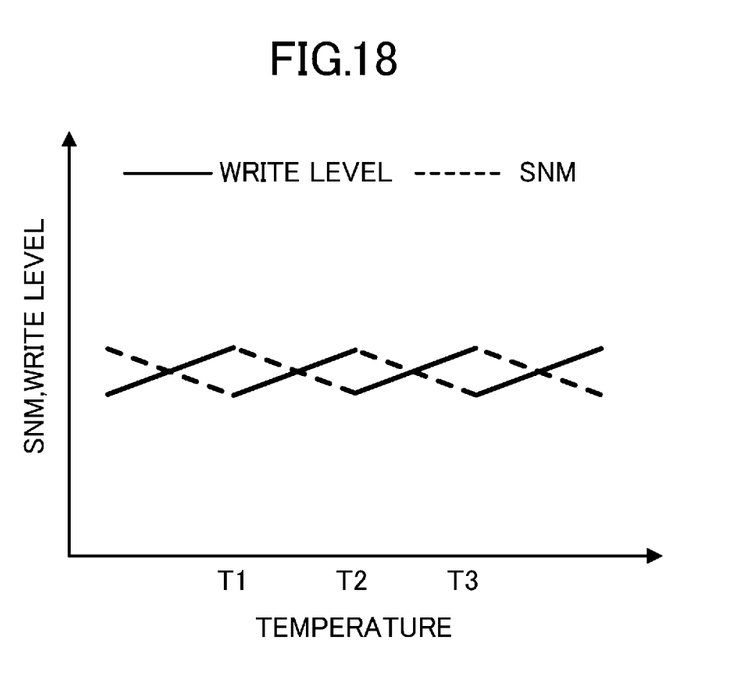
FIG. 18 is a graph showing the relationship between the temperature and the SNM/write level of the semiconductor integrated circuit of the second embodiment.

In this embodiment, the SNM and the write level are smoothed with respect to the temperature change of the semiconductor integrated circuit 1A as shown in FIG. 18. Thus, the SNM and the write level can be improved.

The pull-down circuits 12A and 12B in FIG. 16 each include two p-channel transistors 121 and 122 to allow four-stage setting of the word line activating voltage. Alternatively, the number of p-channel transistors may be increased to allow setting of the word line activating voltage in a larger number of stages. Also, a similar effect can be obtained by using n-channel transistors to constitute the pull-down transistors.

What is claimed is:

1. A semiconductor integrated circuit comprising a memory macro including:
   a plurality of memory cells arranged in a matrix;
   a plurality of word lines corresponding to rows of the plurality of memory cells; and
   a plurality of word line drivers configured to drive the plurality of word lines,
   wherein a voltage of the word lines in their activated state is set to vary with threshold voltage characteristics of a p-channel transistor and an n-channel transistor,
   the voltage of the word lines is set at a first voltage if the threshold voltage of the n-channel transistor is lower than a predetermined voltage, at a second voltage if the threshold voltage of the n-channel transistor is higher than the predetermined voltage, and at the first or second voltage if the threshold voltage of the n-channel transistor is equal to the predetermined voltage, and the predetermined voltage increases with increase in the absolute value of the threshold voltage of the p-channel transistor linearly or in a curve.

2. The semiconductor integrated circuit of claim 1, wherein the first voltage is lower than the second voltage.

3. The semiconductor integrated circuit of claim 1, wherein the p-channel transistor and the n-channel transistor are transistors constituting a semiconductor integrated circuit.

4. The semiconductor integrated circuit of claim 1, wherein the p-channel transistor and the n-channel transistor are transistors constituting a memory macro.

5. The semiconductor integrated circuit of claim 1, wherein the p-channel transistor and the n-channel transistor are transistors constituting a memory cell.

6. The semiconductor integrated circuit of claim 1, wherein the p-channel transistor and the n-channel transistor are transistors for measuring a memory cell characteristic.

7. The semiconductor integrated circuit of claim 6, wherein the transistors for measuring a memory cell characteristic are provided for each semiconductor integrated circuit.

8. The semiconductor integrated circuit of claim 6, wherein the transistors for measuring a memory cell characteristic are provided on a scribe lane of a wafer.

9. The semiconductor integrated circuit of claim 1, wherein the voltage of the word lines in their activated state varies among chips.

10. The semiconductor integrated circuit of claim 1, wherein the voltage of the word lines in their activated state varies among memory macros.

11. A semiconductor integrated circuit comprising a memory macro including:
a plurality of memory cells arranged in a matrix;
a plurality of word lines corresponding to rows of the plurality of memory cells; and
a plurality of word line drivers configured to drive the plurality of word lines,
wherein a voltage of the word lines in their activated state is set to vary with saturation current characteristics of a p-channel transistor and an n-channel transistor,
the voltage of the word lines is set at a first voltage if the saturation current of the re-channel transistor is lower than a predetermined current value, at a second voltage if the saturation current of the n-channel transistor is higher than the predetermined current value, and at the first or second voltage if the saturation current of the n-channel transistor is equal to the predetermined current value, and
the predetermined current value increases with increase in the absolute value of the saturation current value of the p-channel transistor linearly or in a curve.

12. The semiconductor integrated circuit of claim 11, wherein the first voltage is higher than the second voltage.

13. The semiconductor integrated circuit of claim 11, wherein the p-channel transistor and the n-channel transistor are transistors constituting a semiconductor integrated circuit.

14. The semiconductor integrated circuit of claim 11, wherein the p-channel transistor and the n-channel transistor are transistors constituting a memory macro.

15. The semiconductor integrated circuit of claim 11, wherein the p-channel transistor and the n-channel transistor are transistors constituting a memory cell.

16. The semiconductor integrated circuit of claim 11, wherein the p-channel transistor and the n-channel transistor are transistors for measuring a memory cell characteristic.

17. The semiconductor integrated circuit of claim 16, wherein the transistors for measuring a memory cell characteristic are provided for each semiconductor integrated circuit.

18. The semiconductor integrated circuit of claim 16, wherein the transistors for measuring a memory cell characteristic are provided on a scribe lane of a wafer.

19. The semiconductor integrated circuit of claim 11, wherein the voltage of the word lines in their activated state varies among chips.

20. The semiconductor integrated circuit of claim 11, wherein the voltage of the word lines in their activated state varies among memory macros.

21. A semiconductor integrated circuit comprising a memory macro including:
a plurality of memory cells arranged in a matrix;
a plurality of word lines corresponding to rows of the plurality of memory cells; and
a plurality of word line drivers configured to drive the plurality of word lines,
wherein a voltage of the word lines in their activated state is set to vary with drain-source leak current characteristics of a p-channel transistor and an n-channel transistor,
the voltage of the word lines is set at a first voltage if the drain-source leak current of the n-channel transistor is lower than a predetermined current value, at a second voltage if the drain-source leak current of the n-channel transistor is higher than the predetermined current value, and at the first or second voltage if the drain-source leak current of the n-channel transistor is equal to the predetermined current value, and
the predetermined current value increases with increase in the absolute value of the drain-source leak current of the p-channel transistor linearly or in a curve.

22. The semiconductor integrated circuit of claim 21, wherein the first voltage is higher than the second voltage.

23. The semiconductor integrated circuit of claim 21, wherein the p-channel transistor and the n-channel transistor are transistors constituting a semiconductor integrated circuit.

24. The semiconductor integrated circuit of claim 21, wherein the p-channel transistor and the n-channel transistor are transistors constituting a memory macro.

25. The semiconductor integrated circuit of claim 21, wherein the p-channel transistor and the n-channel transistor are transistors constituting a memory cell.

26. The semiconductor integrated circuit of claim 21, wherein the p-channel transistor and the n-channel transistor are transistors for measuring a memory cell characteristic.

27. The semiconductor integrated circuit of claim 26, wherein the transistors for measuring a memory cell characteristic are provided for each semiconductor integrated circuit.

28. The semiconductor integrated circuit of claim 26, wherein the transistors for measuring a memory cell characteristic are provided on a scribe lane of a wafer.

29. The semiconductor integrated circuit of claim 21, wherein the voltage of the word lines in their activated state varies among chips.

30. The semiconductor integrated circuit of claim 21, wherein the voltage of the word lines in their activated state varies among memory macros.

31. A semiconductor integrated circuit comprising a memory macro including:
a plurality of memory cells arranged in a matrix;
a plurality of word lines corresponding to rows of the plurality of memory cells; and a plurality of word line drivers configured to drive the plurality of word lines, wherein a voltage of the word lines in their activated state is set to change at a given chip temperature, and the voltage of the word lines is set at a seventh voltage if the chip temperature is lower than the given chip temperature and at an eighth voltage if the chip temperature is higher than the given chip temperature.

32. The semiconductor integrated circuit of claim 31, wherein the seventh voltage is higher than the eighth voltage.

* * * * *